(12) United States Patent
Roitman et al.

(10) Patent No.: US 6,191,433 B1
(45) Date of Patent: Feb. 20, 2001

(54) OLED DISPLAY DEVICE AND METHOD FOR PATTERNING CATHODES OF THE DEVICE

(75) Inventors: Daniel B. Roitman, Menlo Park; Homer Antoniadis, Mountain View, both of CA (US)

(73) Assignee: Agilent Technologies, Inc., Palo Alto, CA (US)

( * ) Notice: Under 35 U.S.C. 154(b), the term of this patent shall be extended for 0 days.

(21) Appl. No.: 09/528,413

(22) Filed: Mar. 17, 2000

(51) Int. Cl.[7] .............................. H01L 35/24; H01L 51/00
(52) U.S. Cl. ................. 257/40; 257/72; 257/88; 257/98; 257/99; 438/29
(58) Field of Search .................. 438/29; 257/72, 257/40, 88, 98, 99

(56) References Cited

U.S. PATENT DOCUMENTS

| | | | |
|---|---|---|---|
| 5,424,560 | 6/1995 | Norman et al. | 257/40 |
| 5,608,287 | 3/1997 | Hung et al. | 313/503 |
| 5,739,545 | 4/1998 | Guha et al. | 257/40 |
| 5,902,688 | 5/1999 | Antoniadis et al. | 428/690 |
| 5,953,585 | 9/1999 | Miyaguchi | 438/35 |
| 5,965,281 | 10/1999 | Cao | 428/690 |
| 5,972,419 | 10/1999 | Roitman | 427/66 |

*Primary Examiner*—Long Pham

(57) ABSTRACT

An OLED display device and a method of fabricating the device utilize a patterned layer of conductive pads formed over a substrate to fabricate a cathode layer without the need to subsequently pattern the cathode layer to create individually addressable cathodes. The design of the OLED display device is such that the cathode layer is positioned below the anode layer. The OLED display device may be configured to emit light through the substrate or through the top layer, i.e., the anode layer. In a first embodiment, the conductive pads have sharp edges that effectively pattern the cathode layer when it is formed over the pads. In a second embodiment, the conductive pads do not include sharp edges. In this embodiment, the cathode layer is made of a composite material, which includes cathode components and non-conducting components. The composite material allows the resulting cathode layer to have the desired characteristics to effectively inject electrons vertically into the EL region of the device, while limiting lateral conduction between the conductive pads.

19 Claims, 15 Drawing Sheets

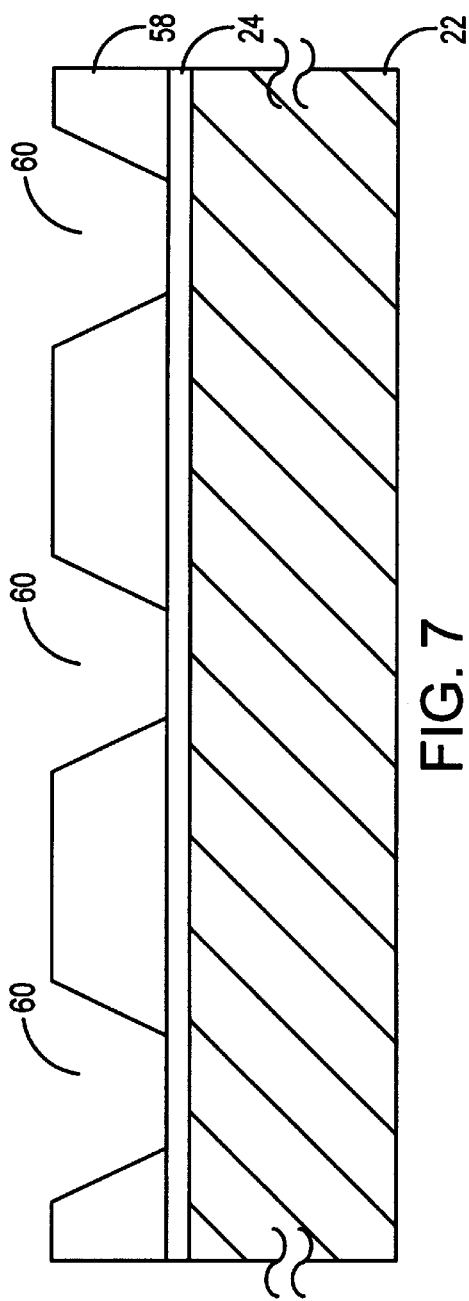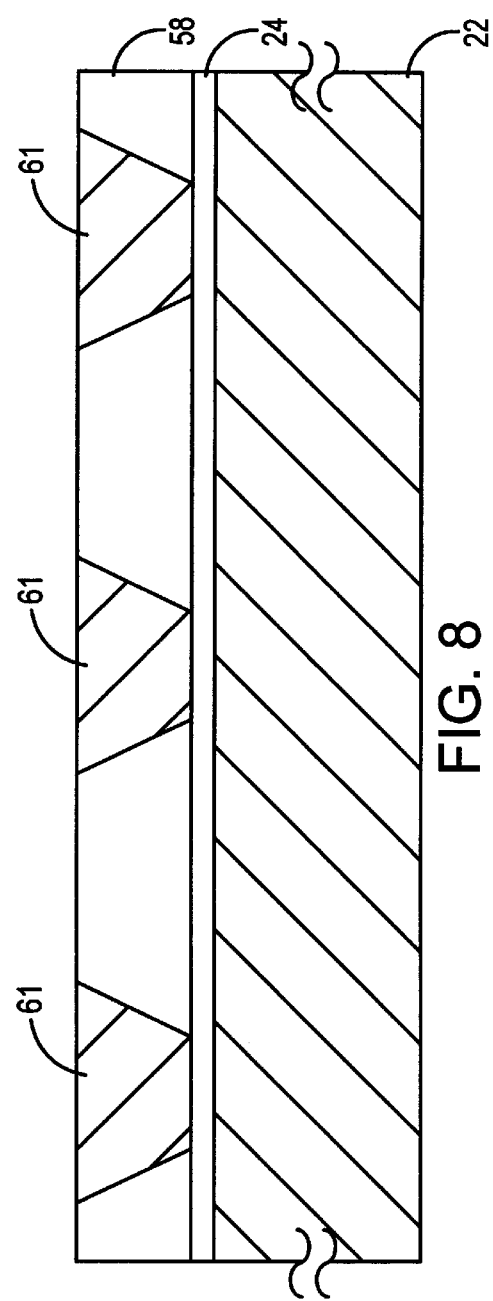

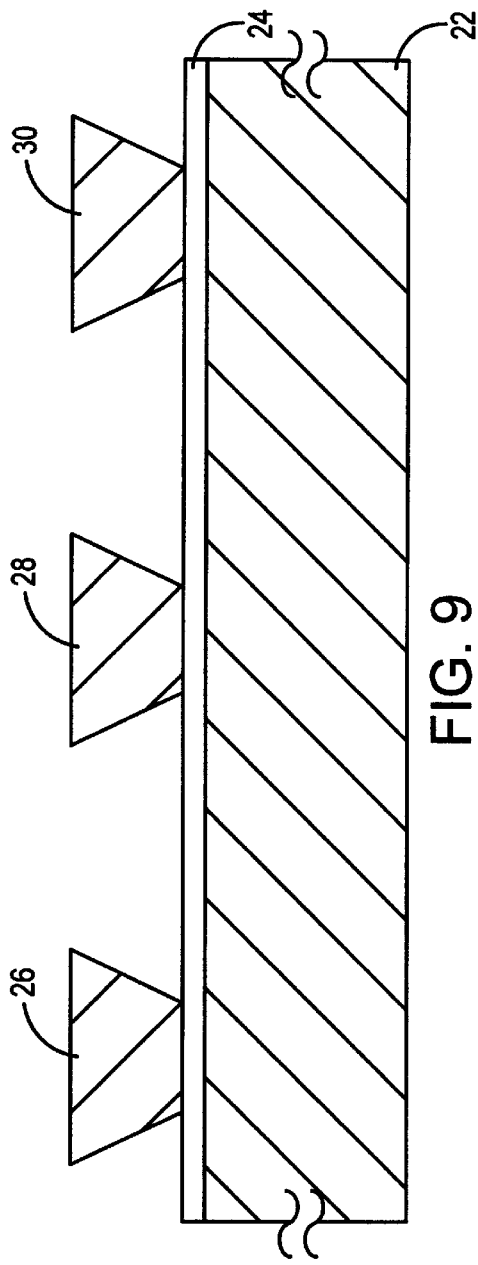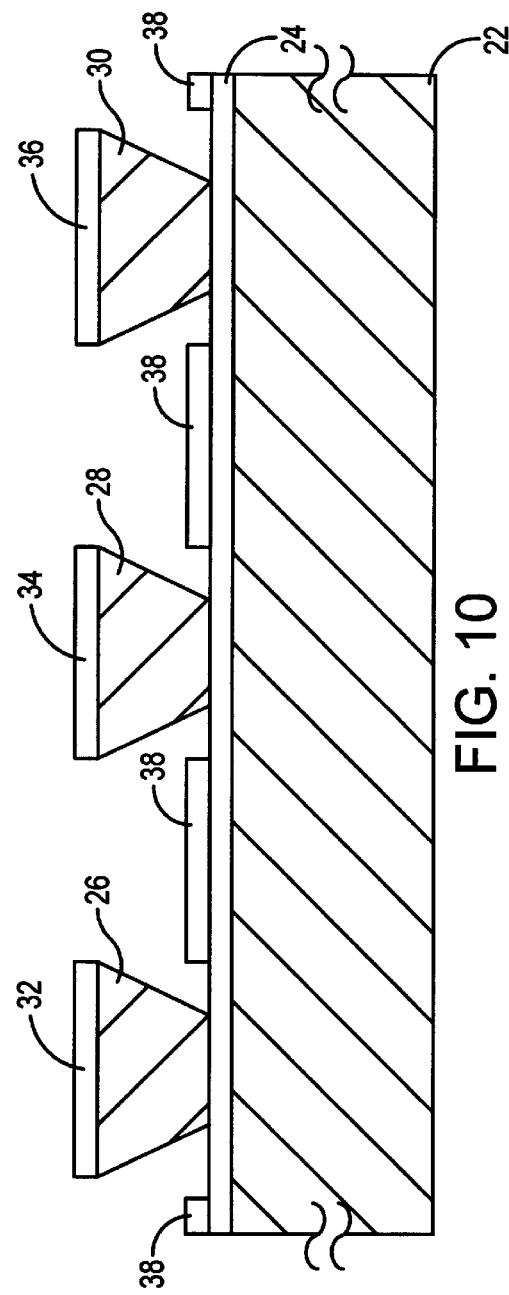

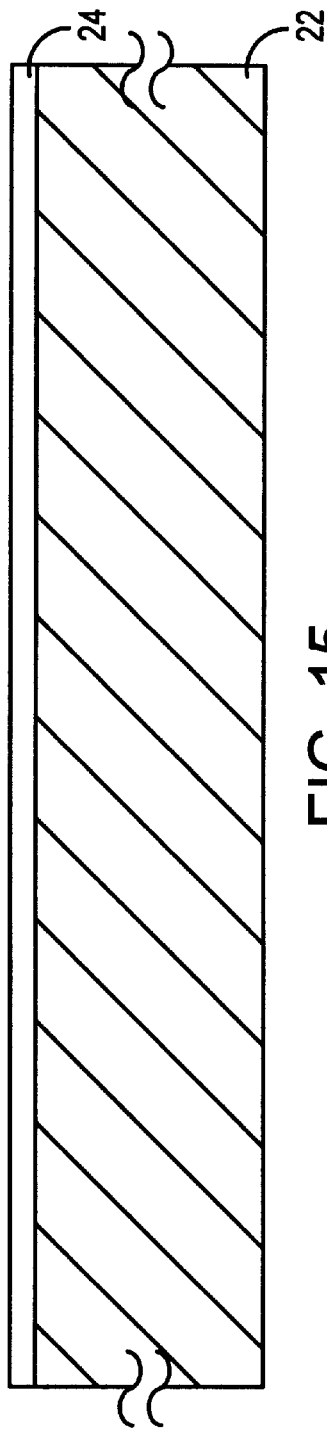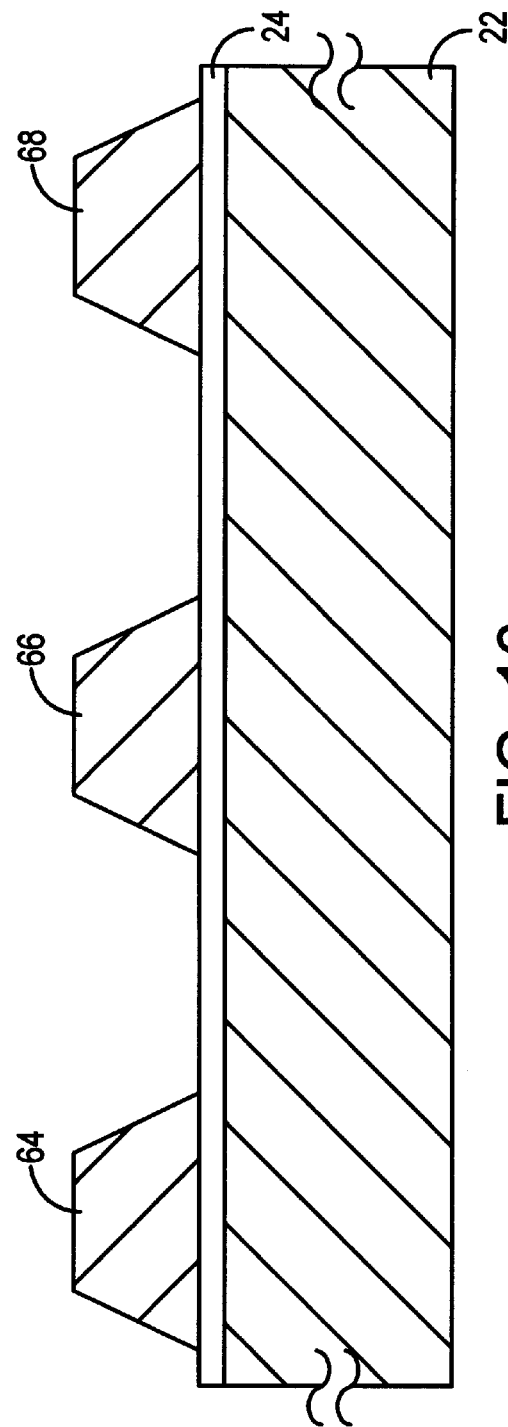

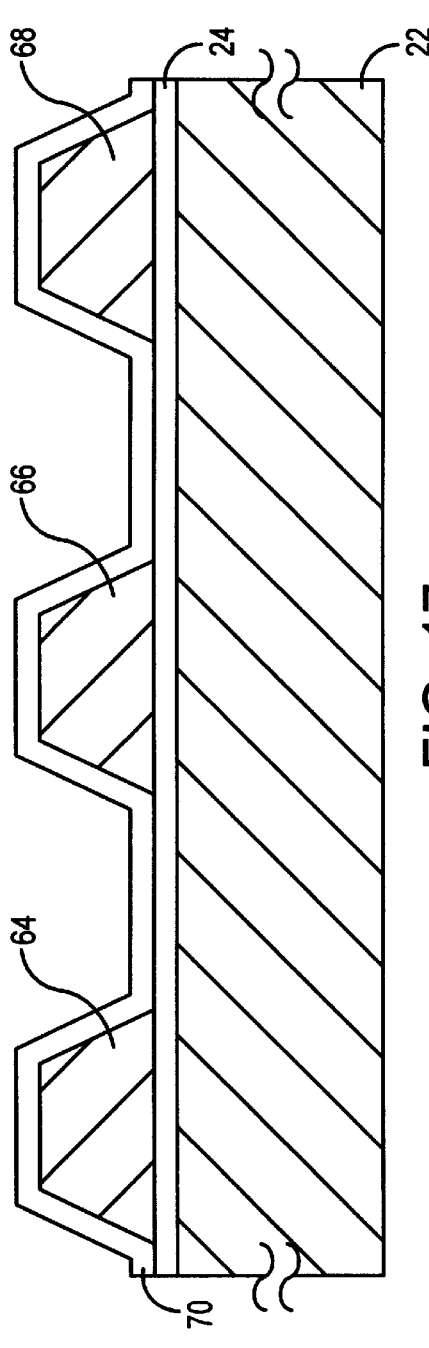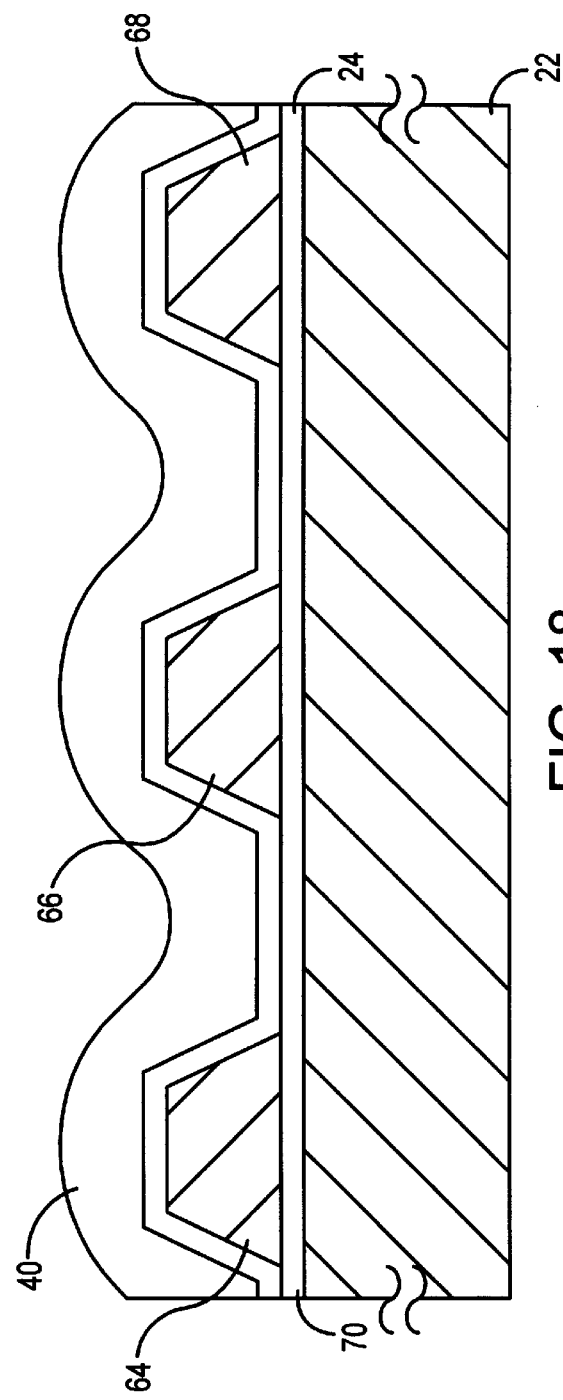

OLED DISPLAY DEVICE AND METHOD FOR PATTERNING CATHODES OF THE DEVICE

TECHNICAL FIELD

The invention relates generally to organic light emitting diode (OLED) structures and more particularly to an OLED display device and a method for patterning cathodes to fabricate the device.

BACKGROUND ART

Organic light emitting diodes (OLEDs) are electroluminescent (EL) devices that emit light generated by radiative recombination of injected electrons and holes within one or more organic EL layers of the OLEDs. OLEDs have electrical and optical characteristics which are attractive for operation within pixel-addressed displays. For example, OLEDs operate at low voltages and are relatively efficient. In addition, OLEDs can be fabricated into thin, lightweight display devices. Furthermore, OLEDs can be designed to emit light of different colors to create color display devices.

In FIG. 1, an OLED display device 10 in accordance with the prior art is illustrated. The OLED display device includes a substrate 12, an anode layer 14, an organic electroluminescent (EL) region 16, and a cathode layer 18. The substrate may be transparent or opaque. Thus, the display device may be configured to emit light through the substrate, or through the cathode layer. If the substrate is transparent, the substrate may be made of silica or plastic. However, if the substrate is opaque, the substrate may be made of Si, plastic or a flexible metal foil. The anode layer is typically made of a transparent conducting material, such as Indium Tin Oxide (ITO), while the cathode layer is typically made of a conducting metal with a low work function, such as Ca or Mg. The anode layer and the cathode layer are patterned, so that individual pixels of the display device can be addressed. The organic EL region is composed of at least one organic or polymer layer.

Although the relative positions of the anode and cathode layers 14 and 18 may be inverted, conventional OLED display devices have typically been configured with the anode layer located between the cathode layer and the substrate, as illustrated by the OLED display device 10 of FIG. 1. The reason for this preference is that the cathode layer is typically made of a low work function metal, which is difficult to pattern, easily oxidized, and not amenable to lithography. Nevertheless, various OLED devices having the alternative orientation of the two layers are known.

U.S. Pat. No. 5,608,287 to Hung et al. describes an OLED display device that includes a cathode layer disposed on a substrate with an anode layer formed over the EL region and the cathode layer. The cathode layer is formed of either metal silicides, such as rare earth silicides, or metal borides, such as lanthanum boride and chromium boride, having a work function of 4.0 eV or less. The composition of the cathode layer is described to provide protection from atmospheric corrosion during fabrication. Another OLED display device that includes a cathode layer disposed directly on a substrate is described in U.S. Pat. No. 5,424,560 to Norman et al. In this device, the cathode layer is formed of low work function material, such as heavily doped diamond, or a conductive metal incorporating Ce, Ca or the like.

Although these known OLED display devices operate well for their intended purpose, what is needed is an OLED display device having a patterned cathode layer positioned below the anode layer and a method of fabricating the display device that eases the process for patterning the cathode layer.

SUMMARY OF THE INVENTION

An OLED display device and a method of fabricating the device utilize a patterned layer of conductive pads formed over a substrate to fabricate a cathode layer without the need to subsequently pattern the cathode layer to create individually addressable cathodes. The design of the OLED display device is such that the cathode layer is positioned below the anode layer. The OLED display device may be configured to emit light through the substrate or through the top layer, i.e., the anode layer.

In a first embodiment, the OLED display device includes the substrate, an optional dielectric layer, the patterned layer of conductive pads, the cathode layer, an EL region, and the anode layer. In this embodiment, the conductive pads, which are formed over the underlying dielectric layer have a cross-sectional profile with sharp edges, so that the overlying cathode layer will not be contiguous. Portions of the cathode layer are formed on the conductive pads, while remaining portions of the cathode layer are formed over exposed areas of the dielectric layer between the pads. Thus, the conductive pads function as an "in situ" shadowing mask that patterns the cathode layer when it is formed.

The cross-sectional profile of the conductive pads may be trapezoidal, such that the portions of the cathode layer deposited over the dielectric layer are not in contact with the conductive pads. Thus, the conductive pads are not electrically shorted by these portions of the cathode layer. In an alternative configuration, the cross-sectional profile is rectangular. In this configuration, the portions of the cathode layer deposited over the dielectric layer may be in contact with the conductive pads. However, the cathode layer is sufficiently thin to prevent or substantially limit any lateral conduction between the conductive pads via the portions of the cathode layer deposited over the dielectric layer. Preferably, the thickness of the cathode layer is at most 10 nm, while the separation distance between two adjacent conductive pads is at least 1 $\mu$m.

In a second embodiment, the conductive pads are configured such that their profile does not have sharp edges. Consequently, the cathode layer that is formed over the conductive pads is contiguous. This is significant since the sharp edges of the conductive pads may detrimentally affect the connectivity of the top electrodes, i.e., the anode layer. In this embodiment, the cathode layer is made of a composite material, which includes cathode components and non-conducting components. The composite material allows the resulting cathode layer to have the desired characteristics to effectively inject electrons vertically into the EL region, while limiting lateral conduction between the conductive pads.

In a preferred embodiment, the cathode layer is formed by co-evaporating the cathode components and the non-conducting components. The desired characteristics of the cathode layer can be achieved by tuning the rates of evaporations. In an alternative configuration, the spaces between the conductive pads may be filled with dielectric material prior to the deposition of the composite material which forms the cathode layer. This provides a planar surface on which subsequent layers of the OLED display device are deposited.

BRIEF DESCRIPTION OF THE DRAWINGS

FIGS. 5 thru 12 are cross-sectional views of the OLED display device of FIG. 2 various steps during the fabrication method.

FIGS. 15 thru 19 are cross-sectional views of the OLED display device of FIG. 12 at various steps during the fabrication method.

DETAILED DESCRIPTION

Figure 1:
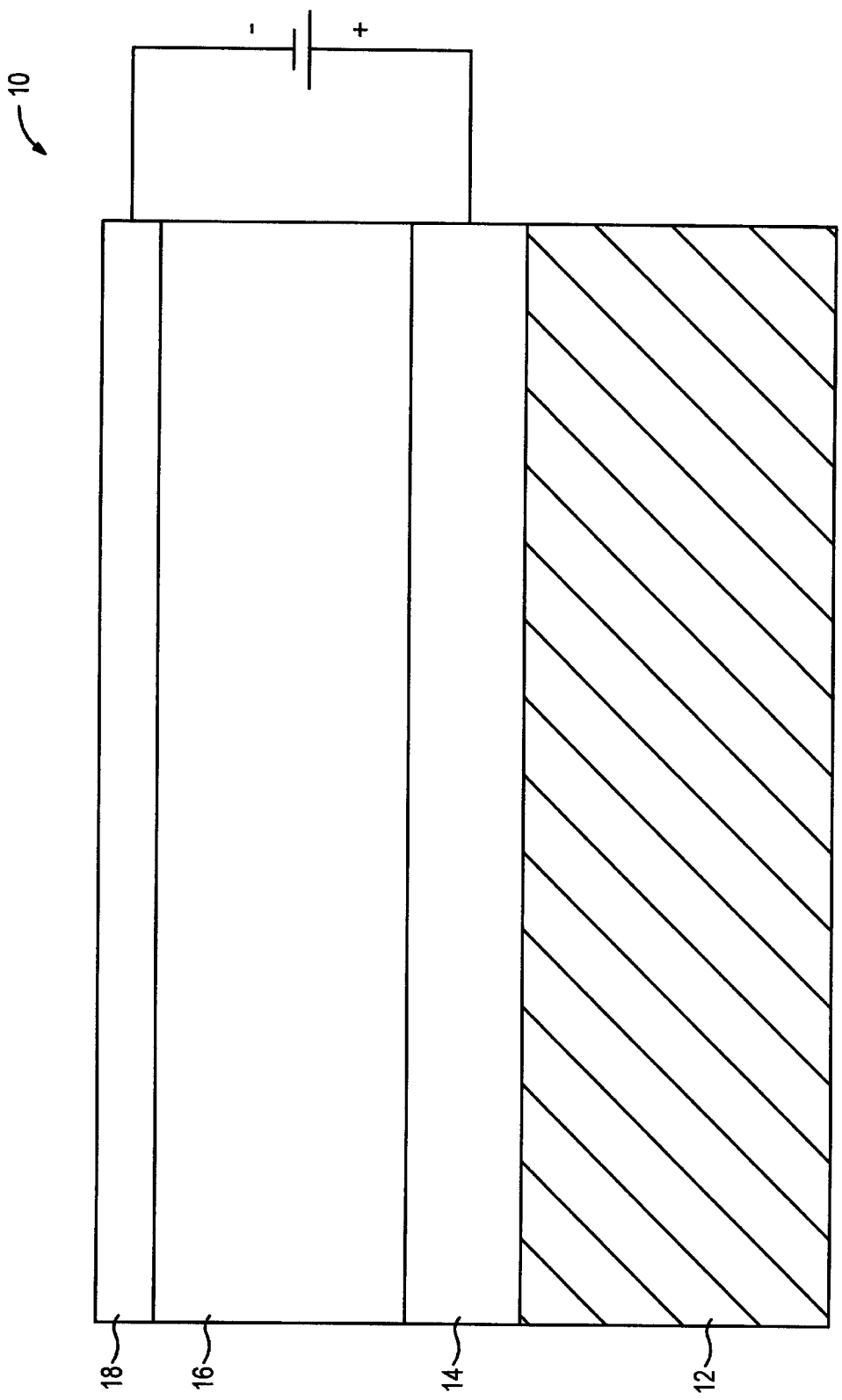
FIG. 1 is a cross-sectional view of an OLED display device in accordance with the prior art.
Figure 2:
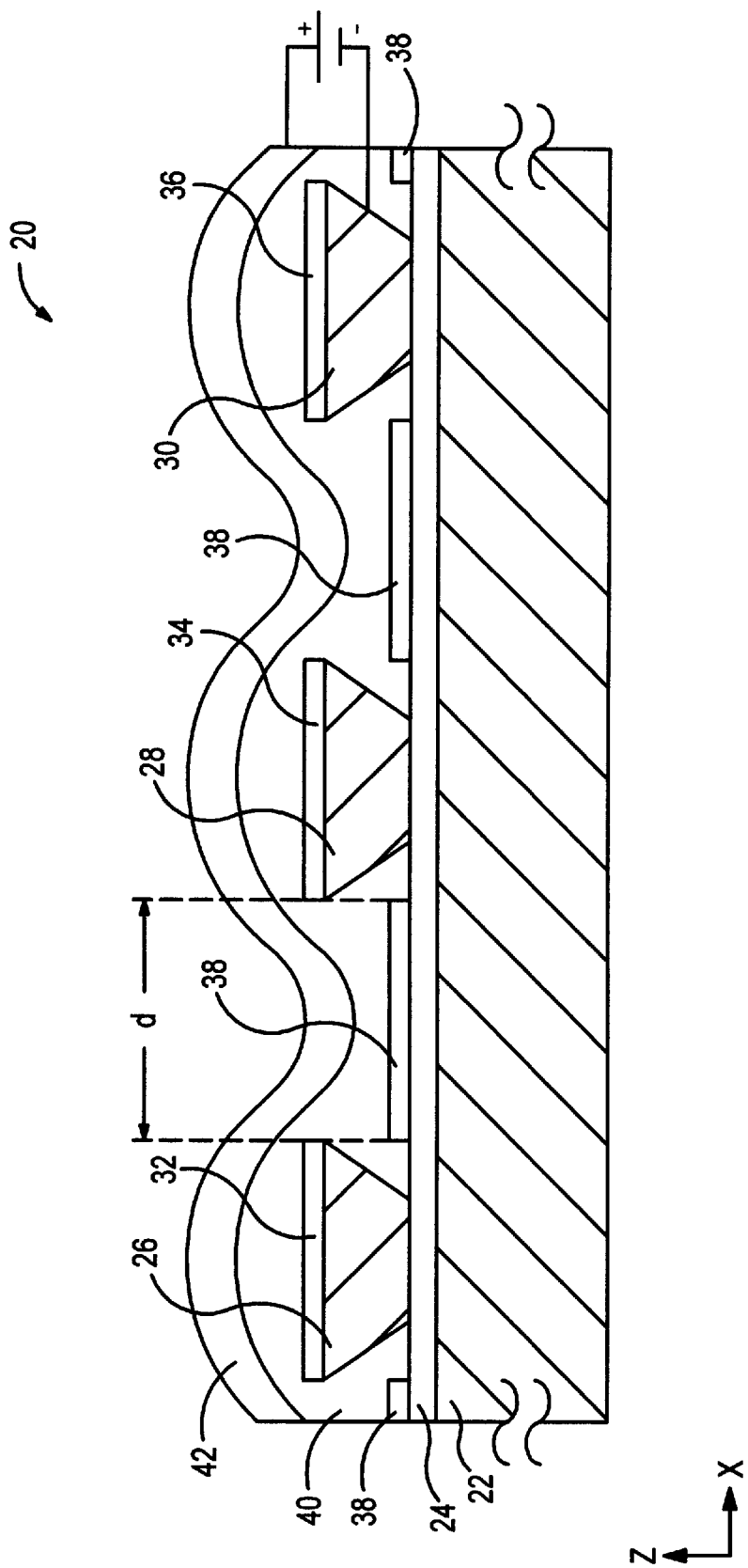
FIG. 2 is a cross-sectional view of an OLED display device in accordance with a first embodiment of the invention.
Figure 3:
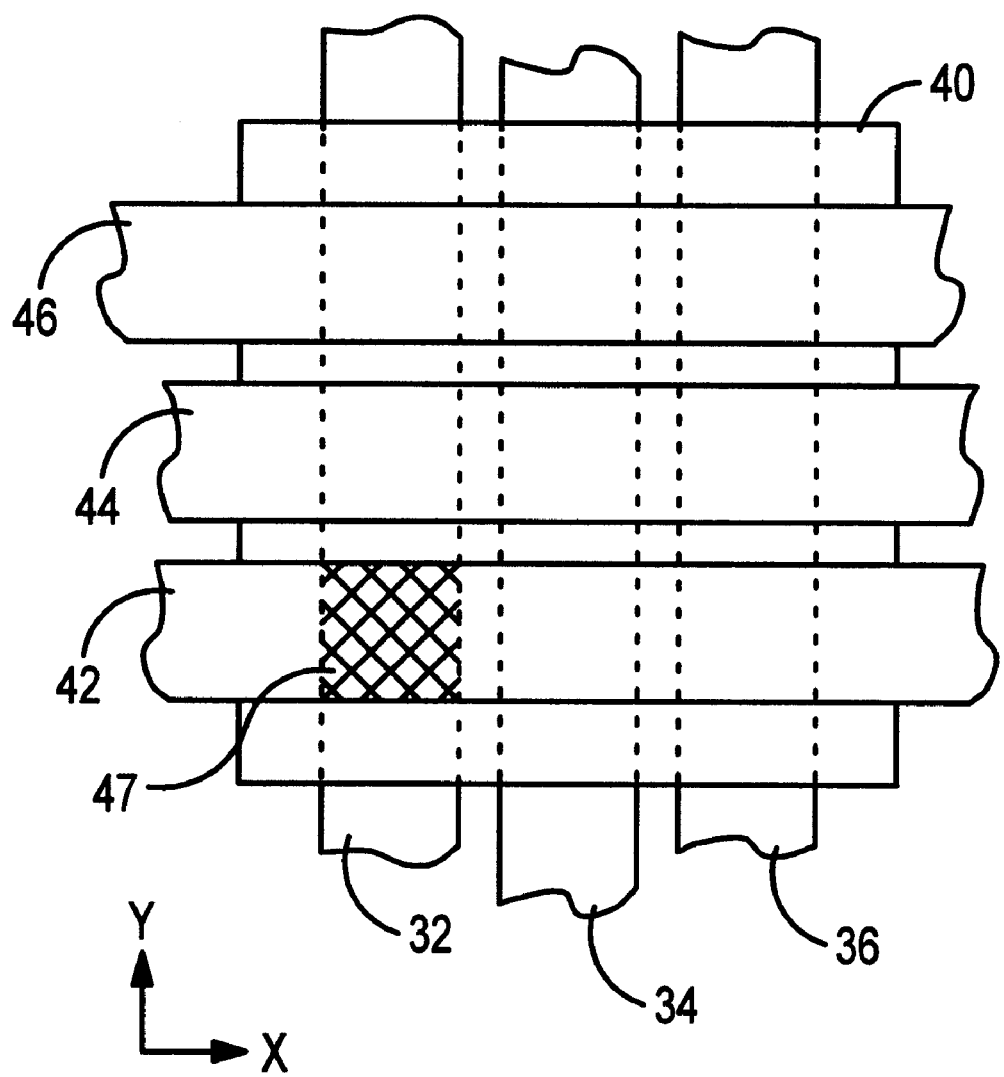
FIG. 3 is a top view of the OLED display device of FIG. 2.
Figure 4:
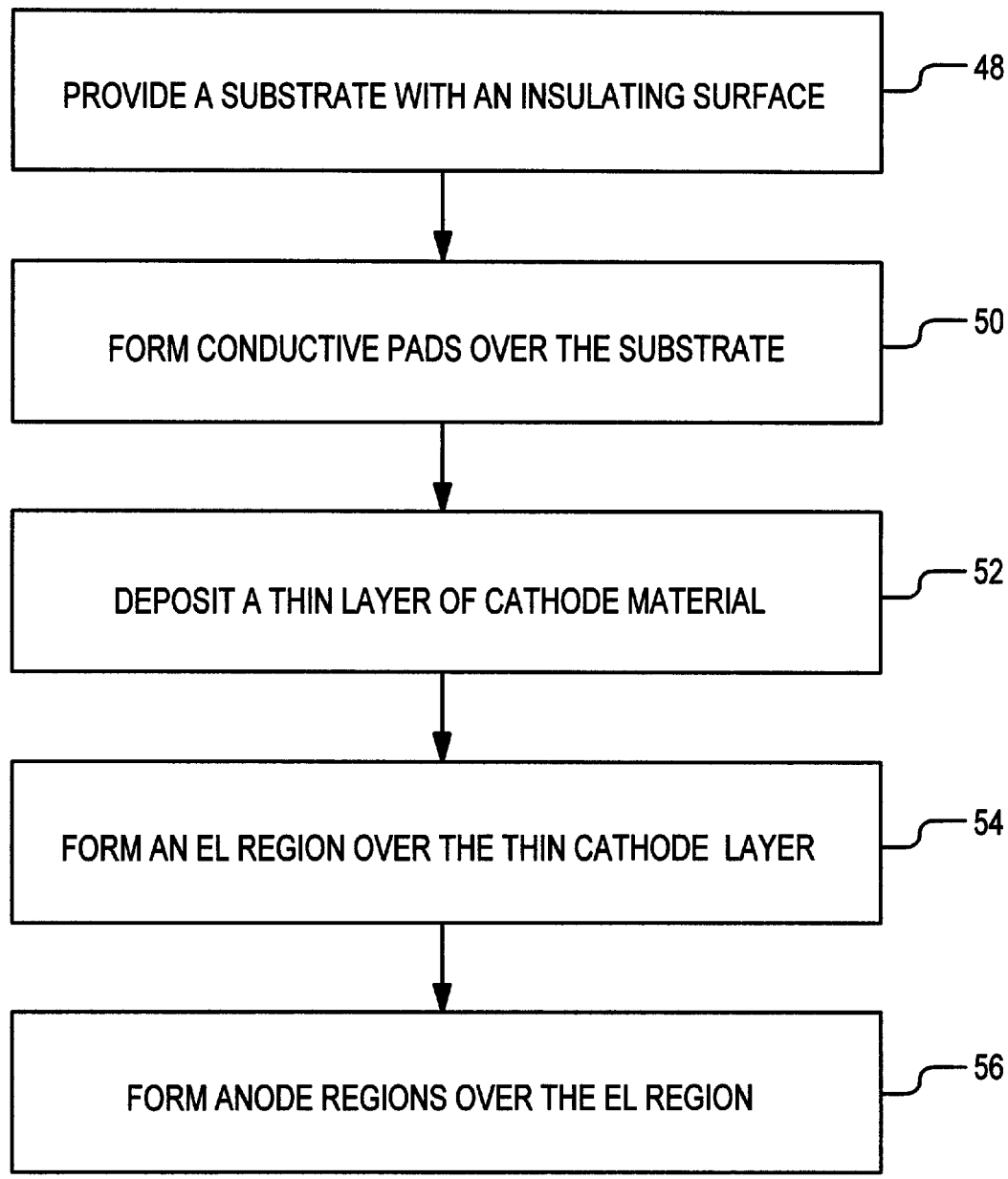
FIG. 4 is a flow diagram of a method of fabricating the OLED display device of FIG. 2.
Figure 5:
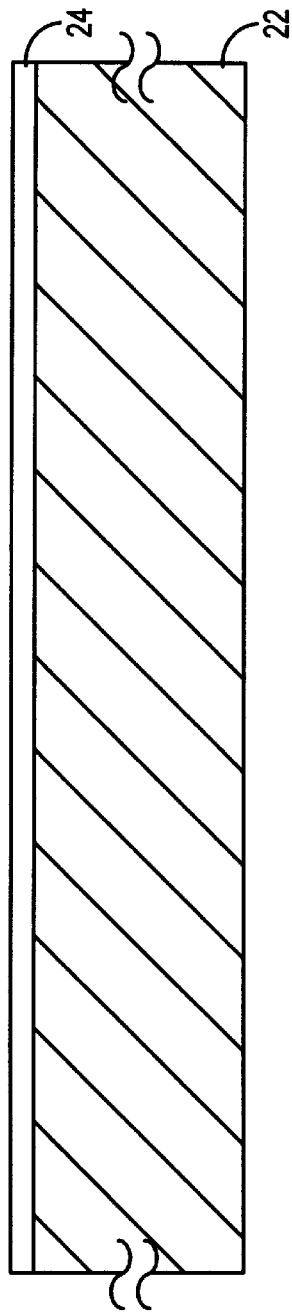

With reference to FIGS. 2 and 3, an OLED display device 20 in accordance with a first embodiment of the invention is shown. FIG. 2 is a cross-sectional view of the device, while FIG. 3 is a top view of the device. The OLED display device includes a substrate 22, an optional dielectric layer 24, conductive pads 26, 28 and 30, a patterned layer of active cathode regions 32, 34 and 36 and inactive cathode regions 38 (not shown in FIG. 3), an EL region 40, and a patterned layer of anode regions 42, 44 and 46 (only the anode region 42 is shown in FIG. 2). The OLED display device operates as a display device by emitting light from various pixel regions. A pixel region is an area defined by the overlap of anode and cathode regions. For example, as illustrated in FIG. 3, a pixel region 47 is defined by the intersection of the anode region 42 and the active cathode region 32. As will be described in detail below, the use of the conductive pads allows the cathode layer to be easily patterned to form the active cathode regions.

The substrate 22 of the OLED display device 20 may be made of a transparent or opaque material. Typically, a transparent substrate is used if the OLED display device is designed to emit light through the substrate. In such a design, the substrate may be made of silica or plastic. However, if the OLED display device is designed to emit light away from the substrate through the layer of anode regions 42, 44 and 46, the substrate may be made of an opaque material, such as Si, plastic or a flexible metal foil. If the OLED display device includes a semiconductive substrate, the optional dielectric layer 24 is deposited over the substrate to electrically isolate the conductive pads 26, 28 and 30 from each other. As an example, the dielectric layer may be a layer of $SiO_2$ grown on the substrate. The type of substrate included in the OLED display device is not critical to the invention.

The conductive pads 26, 28 and 30 of the OLED display device 20 are formed over the dielectric layer 24 or directly over the substrate 22, if the dielectric layer is not present. The conductive pads may be made of Al, Pt, ITO or other comparable conductive materials. The height of the conductive pads is approximately 0.2 $\mu$m, while the separation distance d between two adjacent pads is approximately 1 $\mu$m, but neither of these dimensions is critical. The conductive pads allow current to flow through selected active cathode regions 32, 34 and 36, since each active cathode region is electrically connected to a particular conductive pad. Furthermore, the conductive pads serve as an "in situ" shadow mask when forming the active cathode regions. Each conductive pad has a trapezoidal cross-sectional profile, as shown in FIG. 2. When a layer of cathode material is deposited over the conductive pads, the trapezoidal profile of the pads allows the active cathode regions 32, 34 and 36 to be formed on the conductive pads, which effectively patterns the cathode layer. In addition, this profile allows cathode material to be deposited onto areas of the dielectric layer that are not covered by the conductive pads to form the inactive cathode regions 38. The inactive regions are not in contact with the conductive pads, and therefore, do not electrically short the conductive pads. The inactive cathode regions are by-products of the formation process of the active cathode regions and do not serve any meaningful function.

The active cathode regions 32, 34 and 36 of the OLED display device 20 function as the cathodes for the pixels of the device. The active cathode regions, and consequently the inactive cathode regions 38, are made of a low work function metal to efficiently inject electrons into the EL region 40 for light emission. As an example, the cathode regions may be made of Ca, Yb, Mg or other suitable cathode materials. A preferred thickness of the active cathode regions is approximately 10 nm or less. Formed over the cathode regions is the EL region 40. The EL region includes one or more EL layers, which may be made of an organic or polymer material. In a preferred embodiment, the EL layers are formed of very dry organic solvents, which allow the use of a spin-casting technique to deposit organic materials to form the EL layers without significant degradation of the active cathode regions.

The anode regions 42, 44 and 46 of the OLED display device 20 function as the anodes for the pixels of the device. The anode regions are patterned over the EL region 40. The anode regions are preferably formed of a high work function metal to efficiently inject holes into the EL region for light emission. As an example, the anode regions may be made of ITO or Au. The thickness of the anode regions may be between approximately 25 nm and 35 nm, preferably about 25 nm.

Figure 6:
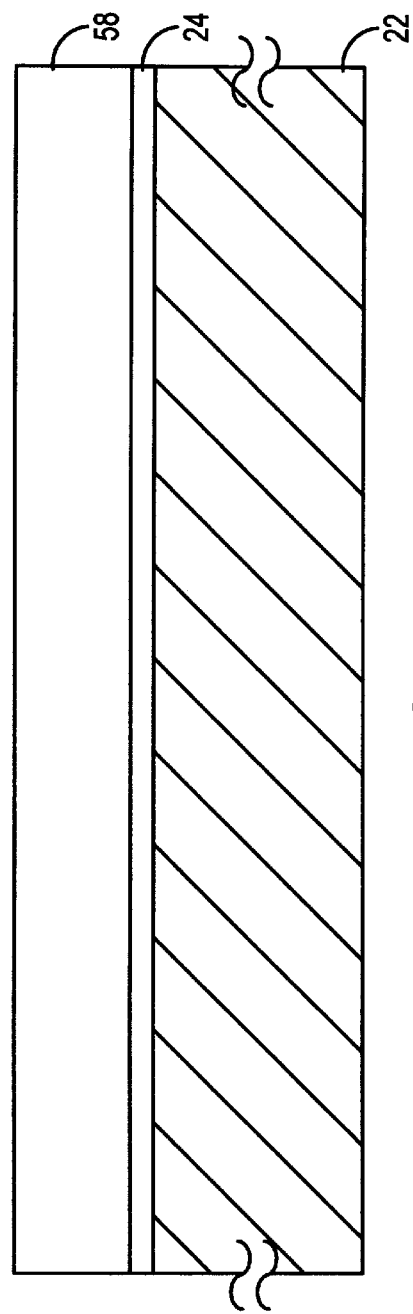

A method of fabricating the OLED display device 20 in accordance with the invention will be described with reference to a flow diagram of FIG. 4 and FIGS. 5–12. During step 48, the substrate 22 with an insulating surface is provided. For example, the insulating surface may be provided by a layer 24 of $SiO_2$, if the substrate is composed of a semiconductive material. Alternatively, the insulating surface may be provided by the substrate, if the substrate is composed of a non-conductive material, such as glass or plastic. Next, the conductive pads 26, 28 and 30 are formed over the substrate using a conventional processing procedure, during step 50. An exemplary procedure to form the conductive pads includes depositing a sacrificial layer 58, as shown in FIG. 6. The sacrificial layer may be a layer of Si, SiN or SiO. The sacrificial layer is then etched using a standard etchant known in the art to define areas 60 on which the conductive pads will be formed, as shown in FIG. 7. Next, a conductive material 61 such as Al is deposited into the areas 60 to form the conductive pads, as shown in FIG. 8. The remaining portions of the sacrificial layer are then removed, leaving only the conductive pads 26, 28 and 30 of FIG. 9. After the conductive pads are formed, a thin layer of cathode material is deposited, e.g., by evaporation, over the conductive pads and exposed area of the dielectric layer to form the active cathode regions 32, 34 and 36 and the inactive cathode regions 38, during step 52, as illustrated in FIG. 10. Thus, the active cathode regions are deposited and patterned in a single step.

Figure 11:
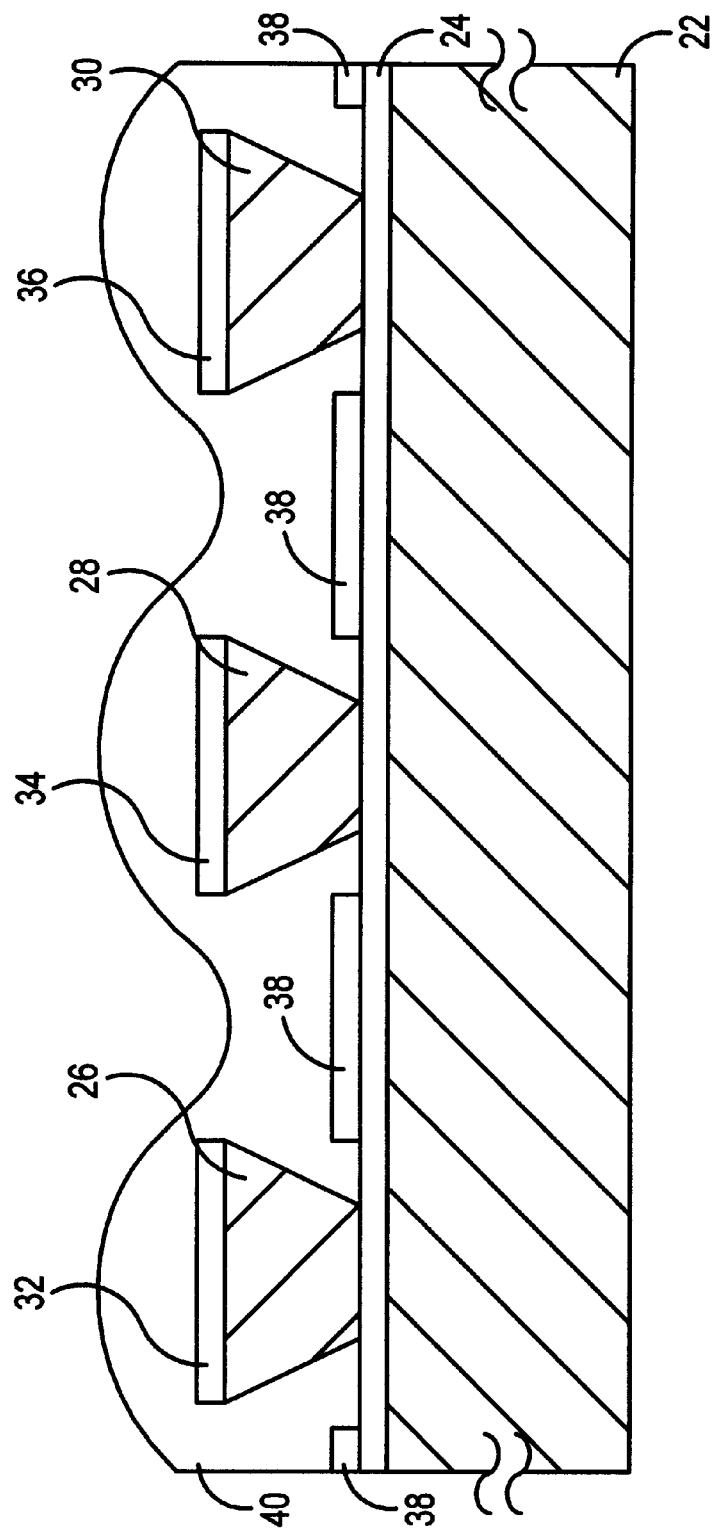
Figure 12:
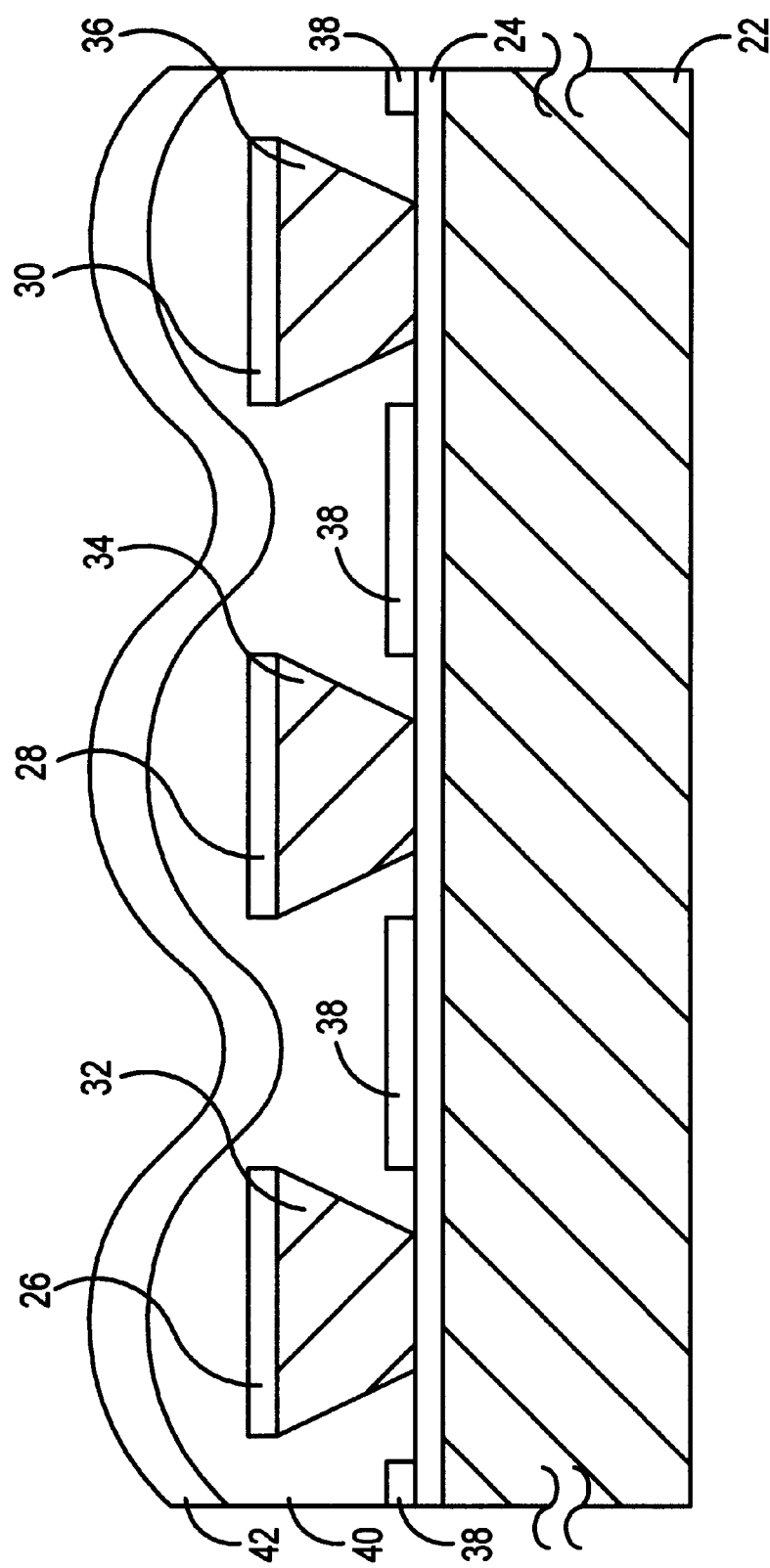

Next, during step 54, the EL region 40 is formed over the cathode regions 32, 34, 36 and 38, as shown in FIG. 11. In a preferred embodiment, the EL region is formed by spin-casting very dry organic solvents to create one or more organic EL layers. Preferably, the steps to form the cathode regions and the EL region are executed in an inert environment, such as in a vacuum or in a Nitrogen-filled environment, to ensure that the cathode regions are not oxidized. During step 56, the anode regions 42, 44 and 46 are formed over the EL region using a conventional processing procedure, as illustrated in FIG. 12 (only the anode region 42 is shown).

Although the preferred cross-sectional profile for the conductive pads 26, 28 and 30 is trapezoidal, the conductive pads may have a more rectangular profile. In such a case, the inactive cathode regions 38 may or may not be in contact with the conductive pads, depending upon such factors as the step coverage of the material used to form the cathode regions. However, the use of conductive pads having a rectangular profile will also create inactive cathode regions that do not electrically short the conductive pads, although the inactive cathode regions may be in contact with the adjacent conductive pads. The reason for this is that the inactive cathode regions are too thin to provide effective lateral conductivity between adjacent conductive pads.

This embodiment was demonstrated for the case in which the conductive pads have a rectangular cross-sectional profile. In this demonstration, the conductive pads were patterned over a glass substrate. Aluminum (Al) was used to form the conductive pads. The thickness and width of the conductive pads were 0.3 $\mu$m and 5 $\mu$m, respectively, with 2 $\mu$m separation between adjacent conductive pads. Next, a thin layer of Ytterbium (Yb), approximately 6 nm thick, was evaporated over the conductive pads to form the cathode regions. A polymer layer having a thickness of 60 nm was deposited by spin-casting polymer solvent on the Yb layer to form a layer of an EL region. A second polymer layer was then deposited over the first polymer EL layer using spin-casting to form a second layer of the EL region for hole transportation. The spin-casting steps were executed in an inert environment. Next, a layer of Au having a thickness of 25 nm was deposited over the second polymer EL layer to form the anode. The resulting device was tested to determine whether the Yb layer was shorting the conductive pads. When activated, the pattern of the conductive pads was visible, demonstrating that the Yb layer was not shorting the conductive pads. This indicates that the edges of the Al conductive pads effectively interrupted the continuity of the Yb layers to form inactive cathode regions that were not in contact with adjacent pads or that the portions of the Yb layer that formed the inactive cathode regions were too thin to provide effective lateral conductivity between the conductive pads.

The efficiency of OLED display devices in accordance with the first embodiment of the invention was tested by comparing devices with the Yb layer and devices without the Yb layer. The devices without the Yb layer were composed of a glass substrate, Al conductive pads (0.4 $\mu$m thick), an EL region (150 nm thick), and Au Anode regions (25 nm thick). With 14.4 V bias, these devices had a current density of about 10 mA/cm$^2$ and a luminance of about 39 Cd/m$^2$, which equates to an efficiency of approximately 0.4 Cd/A. The device with the Yb layer was composed of a glass substrate, a Yb layer (5 nm thick), Al conductive pads (0.4 $\mu$m thick), an EL region (150 nm thick), and Au Anode regions (25 nm thick). With 15 V bias, these devices had a current density of about 10 mA/cm$^2$ and a luminance of about 71 Cd/m$^2$, which equates to an efficiency of approximately 0.7 Cd/A. These tests indicate that in general, the efficiency was about twice as high with the Yb layer than without the Yb layer, suggesting that the electron injection efficiency was not significantly degraded when the polymers were spun from the solution. Even if some degradation did occur, the devices with the Yb layer were nevertheless more efficient.

Figure 13:
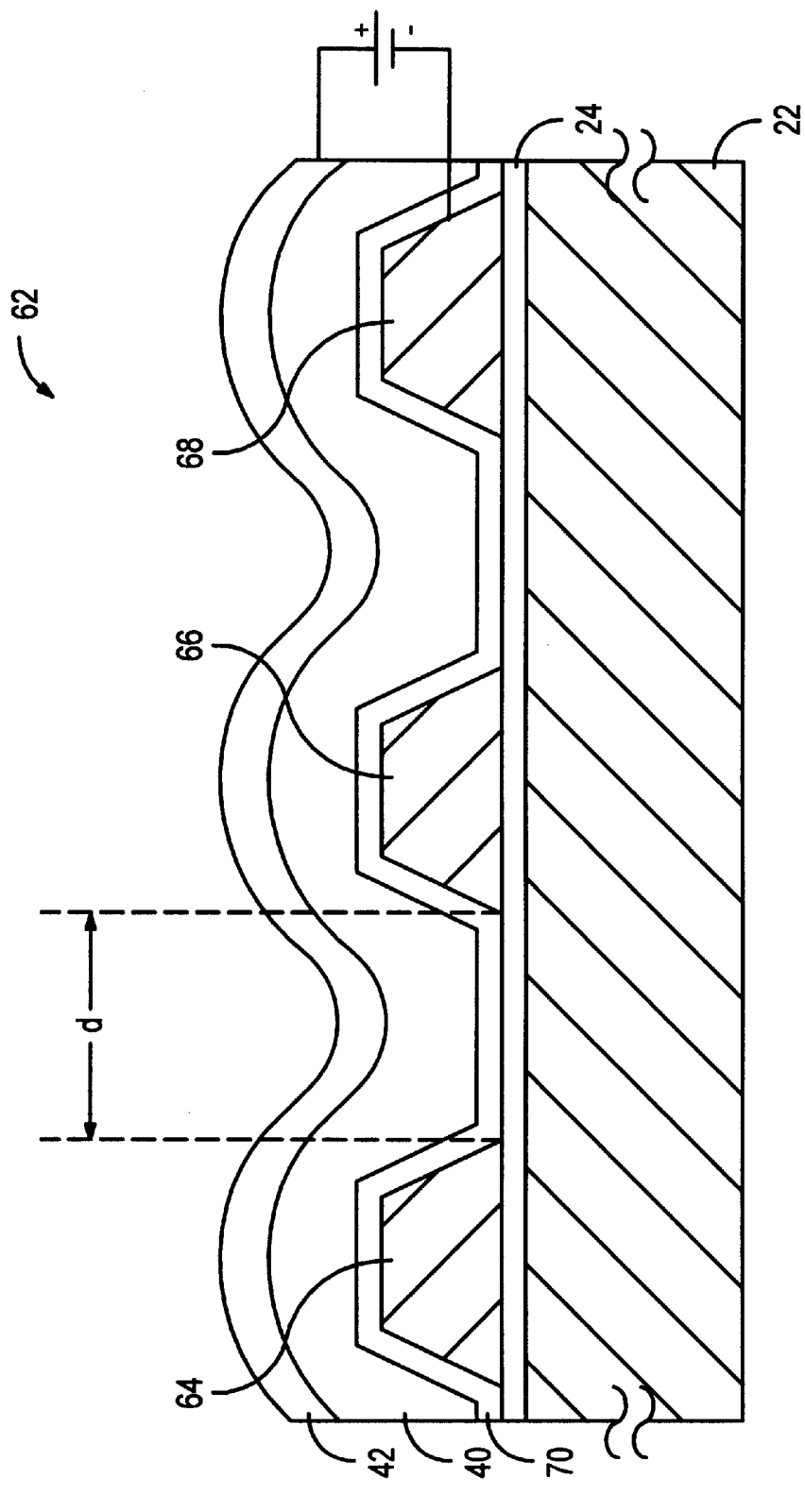
FIG. 13 is a cross-sectional view of an OLED display device in accordance with a second embodiment of the invention.

Turning now to FIG. 13, an OLED display device 62 in accordance with a second embodiment is shown. Similar to the first embodiment, the OLED display device includes the substrate 22, the optional dielectric layer 24 (if the substrate is semiconductive), the EL region 40, and the patterned layer of anode regions 42, 44 and 46 (only the anode region 42 is shown in FIG. 13). However, in this embodiment, the OLED display device includes conductive pads 64, 66 and 68 having a cross-sectional profile without sharp edges. These conductive pads may be composed of Al, Pt, ITO or other comparable material. The height of the conductive pads is approximately 0.3 $\mu$m or greater, while the distance d that separates two adjacent conductive pads is approximately 1 $\mu$m or greater.

The OLED display device 62 also includes a contiguous cathode layer 70 deposited over the conductive pads 64, 66 and 68. The cathode layer is formed of a composite material, which includes cathode components and non-conducting components. The cathode components are low work function metals that are commonly used to form cathodes. Examples of the cathode components are Ca, Yb and Mg. Examples of the non-conducting components are LiF, CsF and CaF$_2$. The cathode layer has a sufficient number of cathode components to provide an effective electron injection in the z-direction (including tunneling) into the EL region 40. However, the non-conducting components of the cathode layer substantially impede lateral conduction in the x-y plane in the "1 micron" distance range. Since adjacent conductive pads are separated by a distance of 1 $\mu$m or more, the cathode layer does not provide significant lateral conduction between the conductive pads. Thus, there is no reason to further pattern the cathode layer to form regions, so that individual pixels of the device can be addressed.

Figure 14:
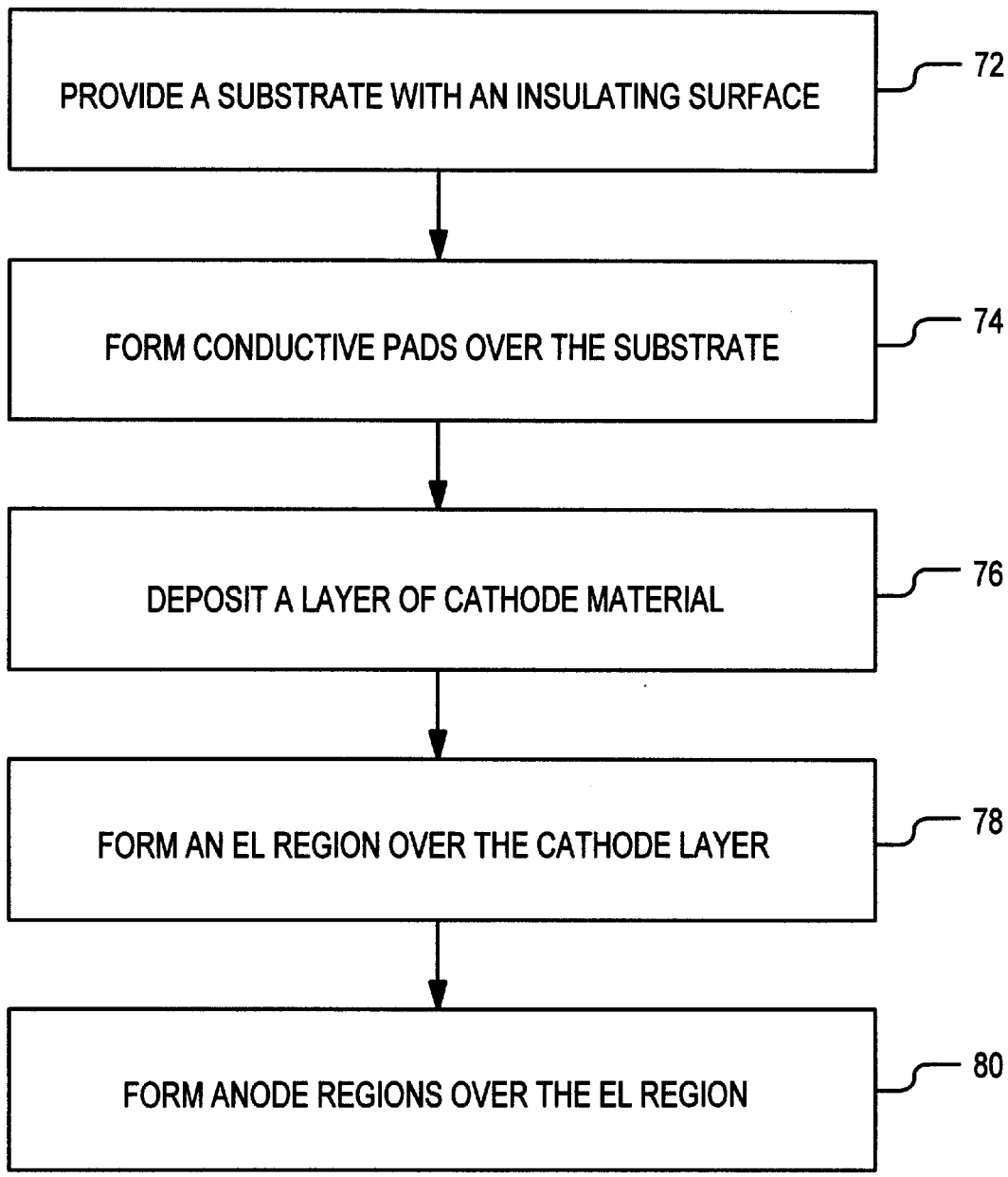
FIG. 14 is a flow diagram of a method of fabricating the OLED display device of FIG. 12.

A method of fabricating the OLED display device 62 will be described with reference to a flow diagram of FIG. 14. During step 72, the substrate 22 with an insulating surface is provided. For example, the insulating surface may be provided by a layer 24 of SiO$_2$, if the substrate is composed of a semiconductive material. Alternatively, the insulating surface may be provided by the substrate, if the substrate is composed of a non-conducive material, such as glass or plastic. Next, during step 74, the conductive pads 64, 66 and 68 are formed over the substrate, as shown in FIG. 16, using a conventional processing procedure which may involve anisotropically etching a deposited layer of conductive material. During step 76, a cathode material is deposited over the conductive pads to form the cathode layer 70, as shown in FIG. 17. In a preferred method, the cathode layer is formed by co-evaporating cathode components and non-conducting components. The co-evaporation may result in a homogeneous dispersion with the assumption that the molecules do not segregate significantly from each other at a mesoscopic scales (thickness of 100 nm). Alternatively, the co-evaporation may result in a heterogenous arrangement where the crystals grow preferentially on top of pre-existing seeds. In either case, it is possible to tune the rates of evaporation to a condition where the resulting cathode layer has the desired characteristics to effectively inject electrons in the z-direction, while limiting lateral conduction in the x-y plane.

Figure 19:
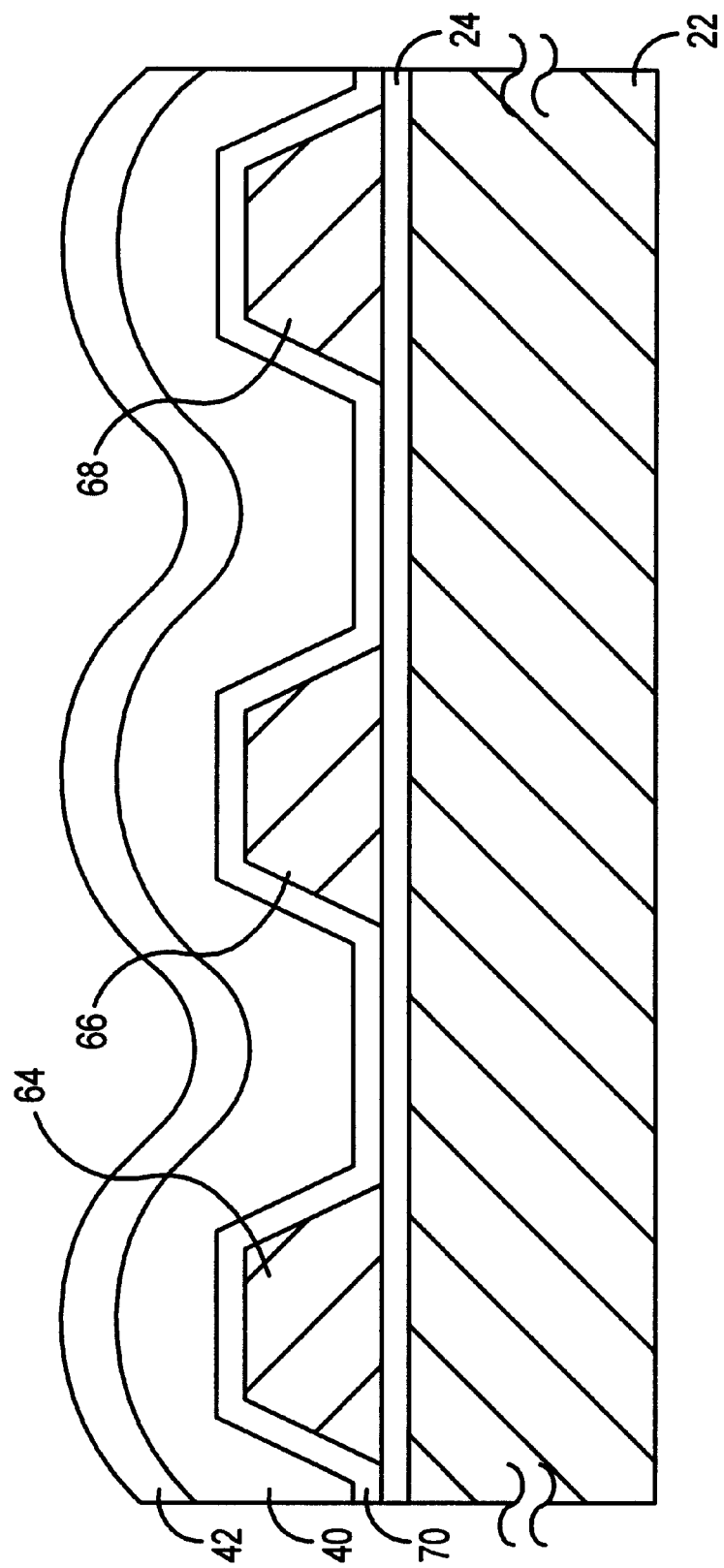

Next, during step 78, the EL region 40 is formed over the cathode layer, as shown in FIG. 18. In a preferred embodiment, the EL region is formed by spin-casting using very dry solvents to create one or more EL (organic or polymer) layers. Preferably, the steps to form the cathode layer and the EL region are executed in an inert environment, such as in a vacuum or in a Nitrogen-filled environment. During step 80, the anode regions 42, 44 and 46 are then formed over the EL region, as illustrated in FIG. 19 (only the anode region 42 is shown).

An advantage of the second embodiment over the first embodiment is that a thicker layer of "cathode material," which is actually a composite, can be used without the need for sharp edge features provided by the conductive pads, as those shown in FIG. 2. This is significant since the sharp edges may detrimentally affect the connectivity of the top electrodes, i.e., the anode regions.

Figure 20:
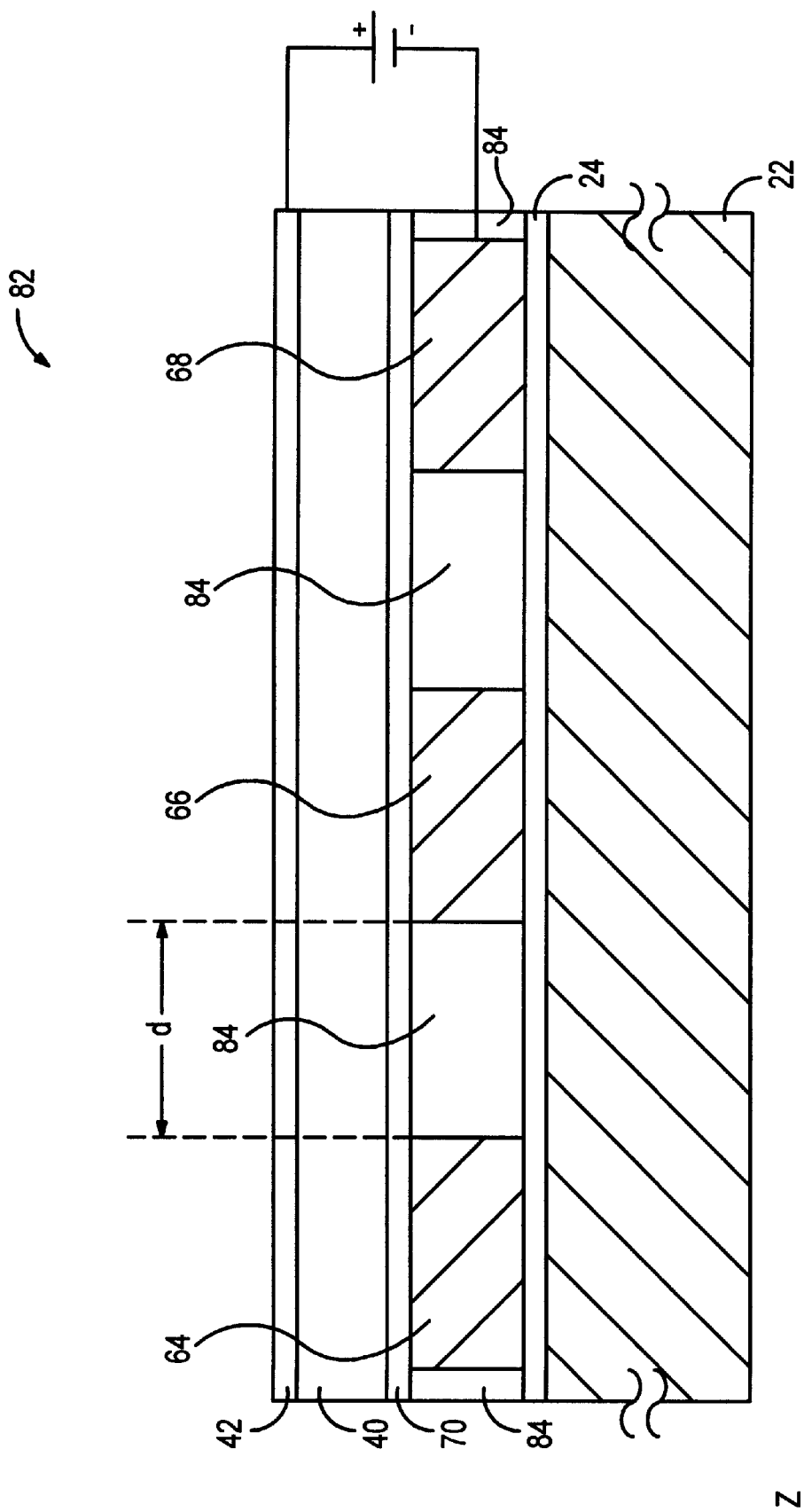
FIG. 20 is a cross-sectional view of an OLED display device that utilizes the approach of the OLED display device of FIG. 13.

An alternative OLED display device 82 using the same approach as the OLED display device 62 of FIG. 13 is shown in FIG. 20. The OLED display device 82 includes the substrate 22, the dielectric layer 24 (if necessary), the conductive pads 64, 66 and 68, the cathode layer 70, the EL region 40, and the anode regions 42, 44 and 46 (only the anode region 42 is shown in FIG. 20). However, the OLED display device also includes dielectric fillers 84 that are positioned between adjacent conductive pads. As an example, the dielectric fillers may be composed of $SiO_2$. These dielectric fillers allow the underlying surface of the cathode layer to be substantially planar. Therefore, the cathode layer formed over the planar surface will also be substantially planar. Consequently, the EL region and the anode regions, which are formed over the cathode layer, are substantially planar as well. In this arrangement, the cross-sectional profile of the conductive pads is not an issue, since the overlying layers of the device are not affected by the profile. The separation distance d should still be approximately 1 $\mu$m or greater, since this provides a sufficient distance between two adjacent conductive pads to limit or prevent lateral conduction between the pads via the cathode layer. The thickness of the conductive pads can be 0.3 $\mu$m or greater, while the thickness of the cathode layer can be 100 nm or greater.

What is claimed is:

1. An electroluminescent device comprising:

a substrate;

a patterned conductive layer positioned over said substrate;

a cathode layer positioned over said patterned conductive layer;

an electroluminescent region positioned over said layer of cathode material; and a layer of anode material positioned over said electroluminescent region.

2. The device of claim 1 wherein said patterned conductive layer fragments said cathode layer such that portions of said cathode layer are not contiguous with other portions of said cathode layer.

3. The device of claim 2 wherein said patterned conductive layer includes separate conductive traces.

4. The device of claim 3 wherein said conductive traces have a substantially rectangular cross-sectional profile.

5. The device of claim 3 wherein said conductive traces have a substantially trapezoidal cross-sectional profile.

6. The device of claim 2 wherein said cathode layer has a thickness of approximately 10 nm or less.

7. The device of claim 2 wherein adjacent conductive traces of said patterned conductive layer are separated by at least 1 $\mu$m.

8. The device of claim 1 wherein said cathode layer is a contiguous layer, said cathode layer having cathode components and non-conducting components.

9. The device of claim 8 wherein said cathode components include an element selected from a group consisting of Ca, Yb and Mg.

10. The device of claim 8 wherein said non-conducting components include a material selected from a group consisting of LiF, CsF and $CaF_2$.

11. The device of claim 8 wherein said conductive traces are separated from each other by at least 1 $\mu$m.

12. The device of claim 8 wherein said cathode layer has a thickness of at least 100 nm.

13. An electroluminescent device comprising:

a substrate;

a patterned electrode layer positioned over said substrate, said patterned electrode layer including at least a first electrode trace and a second electrode trace, said first and second electrode traces being electrically insulated from each other;

a cathode layer positioned over said patterned electrode layer such that a first portion of said cathode layer is on said first electrode trace and a second portion of said cathode layer is on said second electrode trace, said cathode layer being configured so that lateral conduction between said first electrode trace and said second electrode trace is less than longitudinal conduction through each of said first and second electrode traces;

an electroluminescent region positioned over said layer of cathode material; and a layer of anode material positioned over said electroluminescent region.

14. The device of claim 13 wherein said cathode layer has, at most, a thickness of approximately 10 nm.

15. The device of claim 14 wherein said first and second electrode traces have a substantially trapezoidal cross-sectional profile.

16. The device of claim 13 wherein said cathode layer is made of a composite material such that said cathode layer includes cathode components and non-conducting components.

17. The device of claim 16 wherein said cathode components of said cathode layer include an element selected from a group consisting of Ca, Yb and Mg.

18. The device of claim 16 wherein said non-conducting components of said cathode layer include a material selected from a group consisting of LiF, CSF and $CaF_2$.

19. The device of claim 16 wherein said first and second electrode traces are separated from each other by a distance of at least 1 $\mu$m.

* * * * *